United States Patent [19]
Werner, Jr. et al.

[11] Patent Number: 5,473,273
[45] Date of Patent: Dec. 5, 1995

[54] MAXIMUM/MINIMUM HOLD CIRCUIT

[75] Inventors: Alan J. Werner, Jr., Rochester, N.Y.;
Mehrdad Zomorrodi, West Hills,
Calif.; **Mostafa Yazdy; Harry J.
McIntyre**, both of Los Angeles, Calif.

[73] Assignee: Xerox Corporation, Stamford, Conn.

[21] Appl. No.: 138,676

[22] Filed: Oct. 15, 1993

[51] Int. Cl.⁶ ..................................... H03K 5/153
[52] U.S. Cl. ............... 327/94; 307/113; 307/125; 327/58; 327/62; 327/91
[58] Field of Search ................... 307/70, 72, 75, 307/80, 87, 351, 352, 353, 112, 113, 115, 125; 327/58, 59, 60, 62, 91, 93, 94

[56] References Cited

U.S. PATENT DOCUMENTS 4,801,823  1/1989  Yokoyama ................. 307/353
5,124,576  6/1992  Jensen ....................... 307/353
5,324,994  6/1994  Sullivan et al. ............ 307/351
5,378,938  1/1995  Birdsall et al. ............. 327/94

Primary Examiner—William M. Shoop, Jr.
Assistant Examiner—Jonathan S. Kaplan
Attorney, Agent, or Firm—Robert E. Cunha

[57] ABSTRACT

A circuit which can be used to hold either the maximum or minimum voltage applied. A comparator compares the input voltage to the previous high or low and a set of two mirror circuits either charge or discharge a holding capacitor to the new value. A control circuit of transistor switches configures the circuit into either a maximum or minimum holding mode.

2 Claims, 2 Drawing Sheets

MAXIMUM/MINIMUM HOLD CIRCUIT

BACKGROUND OF THE INVENTION

A hold circuit which can be controlled to hold either the peak maximum or minimum voltage applied.

A typical hold circuit follows an input analog signal's level and holds its peak value (maximum hold) or its minimum value (minimum hold). The input signal range of these peak hold circuits is limited by the common-mode range of the internal opamps and requires additional special circuitry to achieve full rail to rail operation.

SUMMARY OF THE INVENTION

The circuit presented herein is an improved peak hold circuit comprising an opamp for charging a capacitor to the peak voltage received, and a steering circuit which will allow the capacitor to charge either up to the maximum applied, or to the minimum applied. The parts count has been minimized by using a circuit consisting of two current mirrors, three opamps and six switching transistors, and the operating range has been expanded by use of rail to rail opamps.

DETAILED DESCRIPTION OF THE INVENTION

Figure 1:
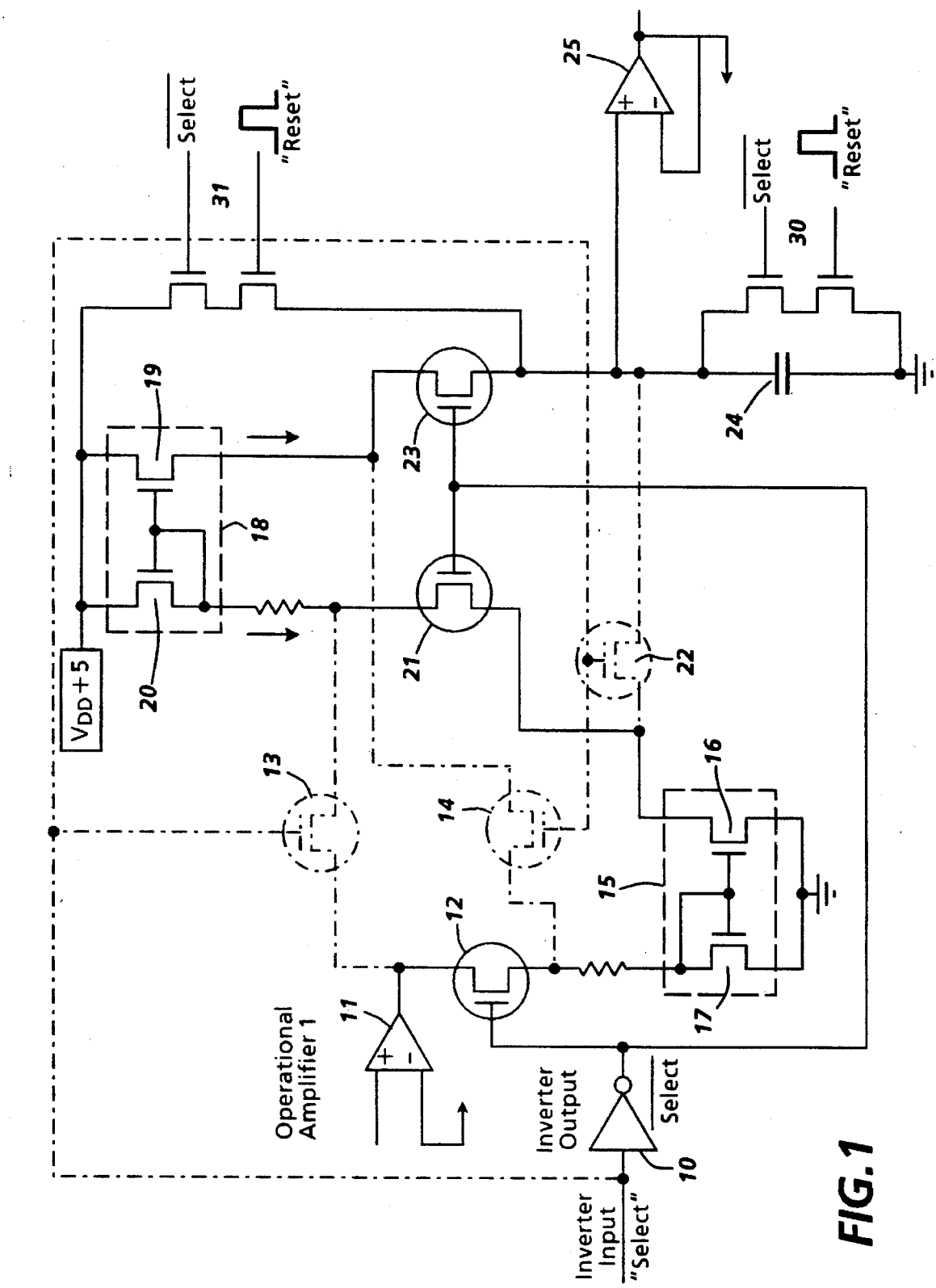
FIG. 1 is a simplified circuit diagram of the invention.

FIG. 1 is an overall schematic diagram of the circuit with the configuration for the max hold circuit shown as shaded transistors connected by solid lines and the min hold circuit shown as transistors and connections shown as dotted lines. The transistors connecting the mirrors, 18, 15, are programmed using the select control line input to inverter 10. When this control line is high, the control signal is connected to transistors 13, 14 and 22 as shown by the dotted lines. These transistors will conduct to connect the mirrors as shown by the dotted lines, and capacitor 24 will be discharged to the minimum value applied at the + input to opamp 11. When the control line is low, the output from the inverter 10 will be high, the mirrors 15, 18, are connected through transistors 12, 21 and 23 as shown by the solid lines, and capacitor 24 is charged to the peak maximum value applied to the + input of opamp 11 to perform a maximum hold function.

Operational amplifiers 11 and 25 are used as input and output amplifiers, respectively. In both cases it may be required that the input and output voltages be anywhere within the full range of voltages, sometimes referred to as "rail-to-rail", between the power supply voltage and ground. A circuit for such an operational amplifier is shown in commonly assigned U.S. Pat. No. 5,015,966, which is incorporated herein by referrence.

The circuit will now be described in more detail as follows. The output voltage of this circuit is held at capacitor 24, and is output through buffer opamp 25 which has its output connected to the inverting input as shown. This connecting arrangement will allow the amplifier to operate as a buffer or voltage follower, meaning that the output voltage of the device will, at all times, be equal to the non-inverting input of the device, which in this case is the voltage at capacitor 24.

The input analog voltage to this circuit is applied to the upper, non-inverting, input of opamp 11, which is operating as a comparator, comparing the inverting input voltage from the output of opamp 25 with the input voltage at the non-inverting input of opamp 11. When the input voltage at opamp 11 is lower than the output voltage at opamp 25, then the output of the comparator opamp 11 is set to its low value, and when the input voltage is higher than the output voltage, the output of the operational amplifier 11 is set to high.

Each mirror 15, 18 consists of two transistors, an input leg, and an output leg, and the gates are connected together so that if current flows in one leg, it will also flow in the other.

Whether the input voltage and these current mirrors 15, 18 will ultimately be used to charge or discharge the capacitor 24 will be determined by the switching transistors, 12, 13, 14, 21, 22 and 23. In this circuit a transistor will conduct when a positive voltage is applied to the gate. Therefore, when the inverter 10 input is high and, as shown by the dashed lines, this voltage is felt at the gates of transistors 13, 14 and 22, the output of opamp 11 will be connected to the left leg of mirror 18 through transistor 13, the right leg of mirror 18 will be connected to the left leg of mirror 15 through transistor 14 and the right side of mirror 15 will be connected to the capacitor 24 through transistor 22. Similarly, when the inverter 10 input is low and therefore the output is high, as shown by the solid lines, this output positive voltage is felt at the gates of transistors 12, 21 and 23, the output of opamp 11 will be connected to the left side of mirror 15 through transistor 12, the right side of mirror 15 will be connected to the left side of mirror 18 through transistor 21 and the right side of mirror 18 will be connected to the capacitor 24 through transistor 23.

The output of the circuit is equal to that of the voltage level of the Capacitor 24. In the Max hold mode, at reset, the capacitor and output voltages are set to 0, and for the remainder of its operation, the capacitor voltage will follow that of the circuit input voltage only if it results in a higher voltage. For example, assume that the input voltage at opamp 11 and the output voltage at opamp 25 are both set to a value of 2 Volts. If at a later time, the input signal is changed to any value lower than 2 volts, then the output of opamp 11 will go low, no current will flow through mirror 15 and subsequent circuit elements of the circuit, and the voltage at the capacitor should remain at the maximum value attained thus far, namely, two volts. However, if the voltage input at opamp 11 is any value greater than 2 volts, the opamp 11 output will go high, and current will flow through the left half of mirror 15, transistor 12 and opamp 11. Mirror 15 will generate current through its right half which will flow through transistor 21 and the left half of mirror 18, and current from the right half of mirror 18 will flow through transistor 23 to charge up capacitor 24. These current flows will continue until the voltage at the capacitor equals that of the input to the operational amplifier 11, at which time, the output of opamp 11 will no longer be high, and the currents will stop, with this high voltage held at the output of the circuit at opamp 25. In other words, in all cases, the output voltage will not follow the input except to a higher value.

The minimum hold circuit operates similarly. In the Min hold mode, at reset, the capacitor and output voltages are set to +5 volts, and for the remainder of its operation, the capacitor voltage will follow that of the circuit input voltage only if it results in a lower voltage. For example, assume that the input voltage at opamp 11 and the output voltage at opamp 25 are both set to a value of 2 volts. If at a later time, the input signal is changed to any value higher than 2 volts, then the output of opamp 11 will go high, no current will flow through mirror 18 and subsequent circuit elements of the circuit, and the voltage at the capacitor will remain at the minimum value attained thus far, namely, two volts. However, if the voltage input at opamp 11 is any value lower than 2 volts, the opamp 11 output will go low, and current will flow through the left half of mirror 18, transistor 13 and opamp 11. Mirror 18 will generate current through its right leg which will flow through transistor 14 and the left leg of mirror 15, and current from the right leg of mirror 15 will flow through transistor 21 to discharge capacitor 24. These current flows will continue until the voltage at the capacitor equals that of the input to the operational amplifier 11, at which time, the output of opamp 11 will no longer be negative, and the currents will stop with this low voltage held at the output of the circuit at opamp 25. In other words, in all cases, the output voltage will not follow the input except to a lower value.

Figure 2:
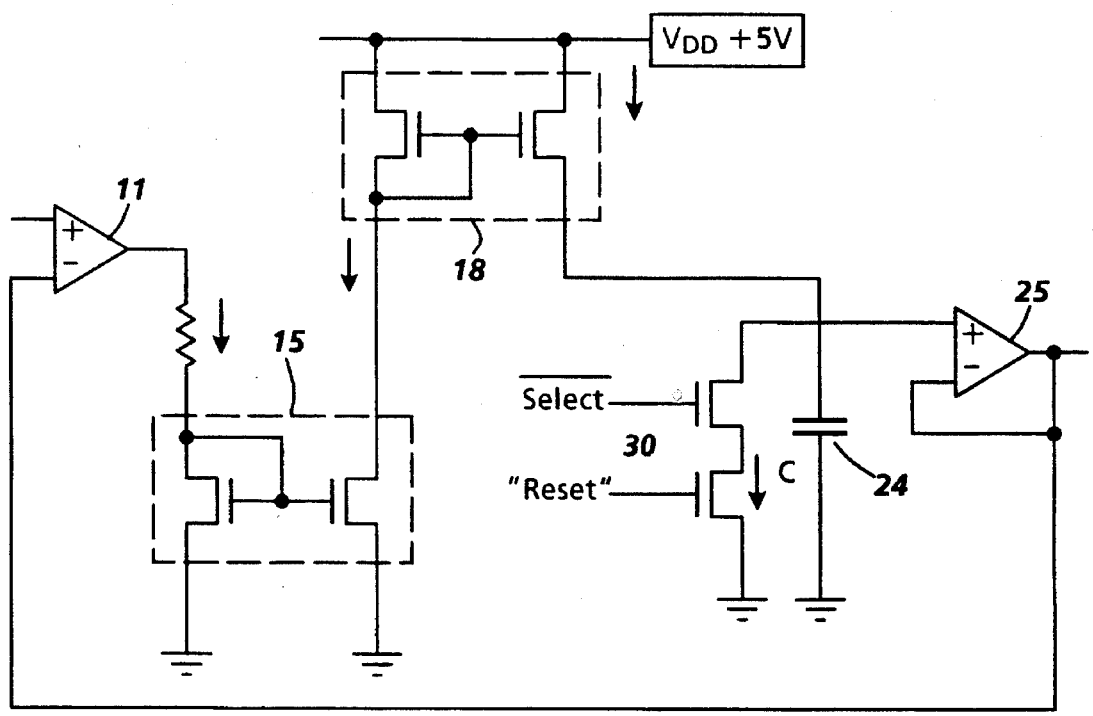
FIG. 2 shows the circuit configured as a max hold circuit.

FIG. 2 shows the equivalent circuit that results when the controlling transistors are set in the Max hold circuit mode. First, switch 30 is momentarily closed to discharge the capacitor 24 to zero. Switch 30 consists of two transistors which are controlled by the signals "RESET" and "SELECT". This switch is always open unless the "RESET" signal is HIGH and the "SELECT" signal is low (Max Hold mode). Only when the Max Hold Mode is selected (i.e. SELECT=LOW) and the "RESET" signal is HIGH this switch closed and capacitor (C) connected to ground (0 Volt). Thereafter, as long as the voltage at the circuit output at the output pin of opamp 25 is lower than the voltage at the + input of the input opamp 11, current will flow in the direction of the arrows; down through the left side of mirror 15, down through the the left side of mirror 18 and the right side of mirror 15, and down through the right side of mirror 18 to charge capacitor 24. This will continue until the capacitor and output voltages equal the input voltage. In contrast, if the circuit output voltage is higher than the + input at the input opamp 11, then the output of opamp 11 will go low and there will be no current. In this way, the output of the circuit will always be set at the maximum voltage that has appeared at the input.

Figure 3:
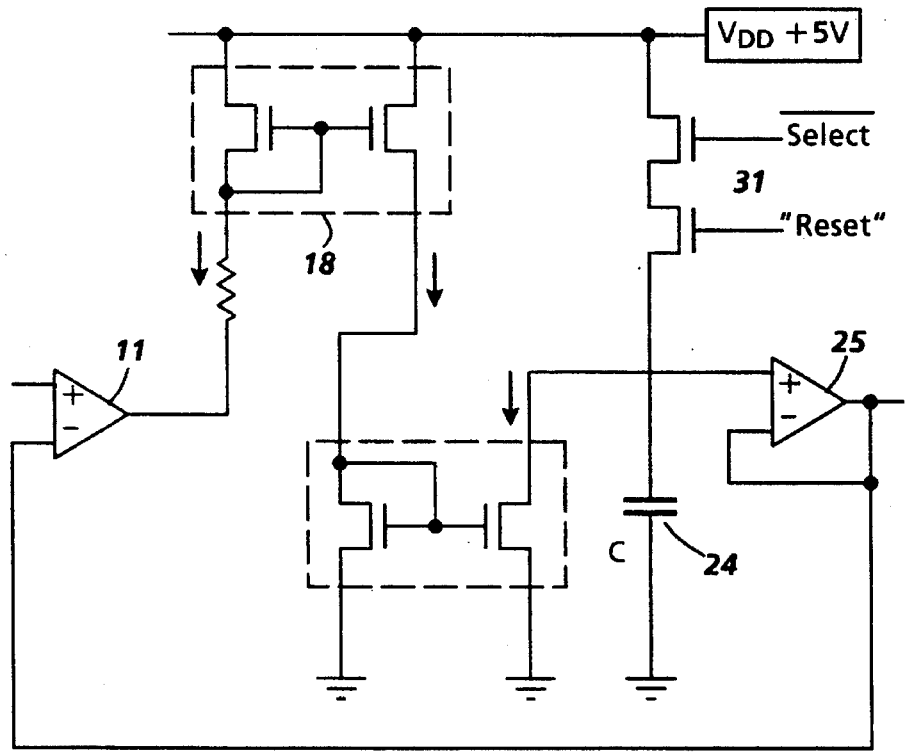
FIG. 3 shows the circuit configured as a min hold circuit.

Similarly, FIG. 3 shows the equivalent circuit that results when the controlling transistors are set in the min hold circuit mode. First, switch 31 is momentarily closed to charge the capacitor 24 to +5 volts. Switch 31 consists of two transistors which are controlled by the "RESET" and "SELECT" signals. This switch is always open unless the "RESET" and "SELECT" signals are simultaneously HIGH. When Min Hold mode is selected (i.e. SELECT=HIGH) and the "RESET" signal is HIGH, this switch is closed and capacitor (C) is connected to $V_{DD}$ (+5 Volts). Thereafter, as long as the voltage at the circuit output at the output pin of opamp 25 is higher than the voltage at the + input of the input opamp 11, current will flow in the direction of the arrows; down through the left side of mirror 18, down through the the right side of mirror 18 and the left side of mirror 15, and down through the right side of mirror 15 to discharge capacitor 24. This will continue until the capacitor and output voltages equal the input voltage. In contrast, if the circuit output voltage is lower than the + input at the input opamp 11, then the output of opamp 11 will go high and there will be no current. In this way, the output of the circuit will always be set at the minimum voltage that has appeared at the input.

It can now be seen that this circuit performs as either a max or min hold circuit with the same circuit components. This circuit will therefore offer these two functions at a lower component cost, lower power consumption, and smaller space requirement.

While the invention has been described with reference to a specific embodiment, it will be understood by those skilled in the art that various changes may be made and equivalents may be substituted for elements thereof without departing from the true spirit and scope of the invention. In addition, many modifications may be made without departing from the essential teachings of the invention.

We claim:

1. A circuit having a circuit input and a circuit output which can be configured to hold and produce as the circuit output either the maximum or minimum voltage supplied as the circuit input comprising:

a source of a first voltage, a source of a second voltage greater than the first voltage, a capacitor having one connection coupled to said first voltage and one other connection, a first mirror circuit having a first and a second section, the first section supplying current to a first connection, the second section supplying current to a second connection, and a third connection common to both sections connected to said second voltage, a second mirror circuit having a first and a second section, the first section receiving current at a first connection, the second section receiving current at a second connection, and a third connection common to both sections connected to said first voltage, a comparator having a reference input, a signal input and an output, the circuit input applied to said signal input, said output being at a low state when a signal applied to said signal input is lower than the reference, said output at a high state when a signal applied to said signal input is higher than said reference, first means for coupling said first connection of said first mirror circuit to said comparator output, second means for coupling said second connection of said first mirror circuit to said first connection of said second mirror circuit, and third means for coupling said other connection of said capacitor to said second connection of said second mirror circuit, to form a minimum hold circuit, and fourth means for coupling said comparator output to said first connection of said second mirror circuit, fifth means for coupling said first connection of said first mirror circuit to said second connection of said second mirror circuit, and sixth means for coupling said second connection of said first mirror circuit to said other connection of said capacitor to form a maximum hold circuit, and wherein said other connection of said capacitor is coupled to said reference input to said comparator and to said circuit output.

2. The circuit of claim 1 further comprising means for enabling either said first, second and third means or said fourth, fifth and sixth means.

* * * * *